United States Patent
Kang et al.

(10) Patent No.: US 9,356,564 B1
(45) Date of Patent: May 31, 2016

(54) BROADBAND LINEAR AMPLIFIER ARCHITECTURE BY COMBINING TWO DISTRIBUTED AMPLIFIERS

(71) Applicant: HRL Laboratories, LLC, Malibu, CA (US)

(72) Inventors: Jongchan Kang, Moorpark, CA (US); Jeong-Sun Moon, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/228,169

(22) Filed: Mar. 27, 2014

(51) Int. Cl.
  *H03F 3/60*     (2006.01)
  *H03F 3/68*     (2006.01)
  *H03F 1/32*     (2006.01)
  *H03F 3/21*     (2006.01)
  *H03F 3/193*    (2006.01)

(52) U.S. Cl.
  CPC ............. *H03F 1/3205* (2013.01); *H03F 3/193* (2013.01); *H03F 3/211* (2013.01)

(58) Field of Classification Search
  CPC ......... H03F 3/211; H03F 3/602; H03F 3/604; H03F 3/45183; H03F 1/301; H03F 1/302; H03F 2200/18
  USPC .................................. 330/253, 295–296, 286
  See application file for complete search history.

(56) References Cited

U.S. PATENT DOCUMENTS

| | | | | |
|---|---|---|---|---|
| 6,456,125 B1 * | 9/2002 | Miyazawa | ............... | H01L 23/66 327/113 |
| 6,819,184 B2 * | 11/2004 | Pengelly | ............... | H03F 1/3205 330/286 |
| 7,804,362 B2 * | 9/2010 | Nguyen | ................... | H03F 1/342 330/286 |
| 8,131,232 B2 * | 3/2012 | Muhammad | ......... | H04B 1/0458 330/86 |
| 8,823,455 B2 * | 9/2014 | Kobayashi | .............. | H03F 3/189 330/286 |
| 2007/0229165 A1 * | 10/2007 | Elmala et al. | ................. | 330/286 |
| 2007/0298736 A1 * | 12/2007 | Fujioka | ................. | H03F 1/0266 455/127.3 |

OTHER PUBLICATIONS

Frederic H. Raab et al, "Power Amplifier and Transmitter for RF and Microwave", IEEE Transactions on Microwave Theory and Techniques, vol. 50, No. 3, Mar. 2002, pp. 814-826.*

Kim, J.H.; Cho, C.S.; Lee, J.W.; and Kim, J., "Linearity Improvement of Class-E Doherty Amplifier Using gm3 Cancellation", Electronics Letters vol. 44, Issue: 5.

(Continued)

*Primary Examiner* — Steven J Mottola
*Assistant Examiner* — Hafizur Rahman
(74) *Attorney, Agent, or Firm* — Ladas & Parry

(57) ABSTRACT

A broadband linear amplifier including an input, a first distributed amplifier coupled to the input and having a bias for one of Class A or Class AB operation, the first distributed amplifier including a first plurality of field effect transistors and having a first output, a second distributed amplifier coupled to the input and having a bias for Class C operation, the second distributed amplifier including a second plurality of field effect transistors and having a second output, and a summed output coupled to the first output and the second output, wherein gate widths of the first plurality of field effect transistors monotonically decrease from the input to the first output, and wherein gate widths of the second plurality of field effect transistors monotonically decrease from the input to the second output.

21 Claims, 7 Drawing Sheets

(56) References Cited

OTHER PUBLICATIONS

Rajashekharaiah, M.; Upadhyaya, P.; and Deukhyoun Heo, "Enhance gm3 Cancellation or Linearity Improvement in CMOS LNA" IMS2006.

El-Khatib, Z.; MacEachern, L.; and Mahmoud, S.A.,"CMOS Interleaved Distributed 2×3 Matrix Amplifier Employing Active Post Distortion and Optimum Gate Bias Linearization Technique" Electrical and Computer Engineering 2010.

* cited by examiner

Prior Art

BROADBAND LINEAR AMPLIFIER ARCHITECTURE BY COMBINING TWO DISTRIBUTED AMPLIFIERS

STATEMENT REGARDING FEDERAL FUNDING

This invention was made under U.S. Government contract N00014-11-C-0126. The U.S. Government has certain rights in this invention.

CROSS REFERENCE TO RELATED APPLICATIONS

None

TECHNICAL FIELD

This disclosure relates to amplifier circuits, low noise amplifiers and power amplifiers.

BACKGROUND

Linearity improvement in amplifiers by using gm3 cancellation is a widely used technique in power amplifiers and low noise amplifiers as described by Kim, J. H., Cho, C. S., Lee, J. W., and Kim, J. in "Linearity Improvement of Class-E Doherty Amplifier Using gm3 Cancellation" Electronics Letters Volume: 44, Issue: 5, and by Rajashekharaiah, M., Upadhyaya, P., and Deukhyoun Heo in "Enhance gm3 Cancellation or Linearity Improvement in CMOS LNA" IMS2006.

The gm3 cancellation method is one method used to remove third-order intermodulation distortion (IMD3). However, gm3 cancellation happens only within a narrow bandwidth, because it is hard to cancel the exact amplitude and phase of two third harmonics across a broad bandwidth.

Also in the prior art, many broadband amplifiers are realized based on distributed amplifier architectures; however, such architectures are known to be proper only for achieving broadband gain, because linearity is generally neglected or sacrificed to obtain the broadband gain.

A gm3 cancellation circuit for a CMOS based distributed amplifier is described by El-Khatib, Z., MacEachern, L., and Mahmoud, S. A. in "CMOS Interleaved Distributed 2×3 Matrix Amplifier Employing Active Post Distortion and Optimum Gate Bias Linearization Technique" Electrical and Computer Engineering 2010; however, the distributed amplifier paired two transistors as one cell, which is difficult to adapt to a compound based semiconductor process, because only one threshold voltage is available. Also, as described, a huge capacitor is needed on every unit cell to separate each device gate bias, which makes a circuit layout very messy and makes routing transmission lines with the proper length difficult.

What is needed are power amplifiers and amplifiers for LNAs that have broadband linearity. The embodiments of the present disclosure answer these and other needs.

SUMMARY

In a first embodiment disclosed herein, a broadband linear amplifier comprises an input, a first distributed amplifier coupled to the input and having a bias for one of Class A or Class AB operation, the first distributed amplifier comprising a first plurality of field effect transistors and having a first output, a second distributed amplifier coupled to the input and having a bias for Class C operation, the second distributed amplifier comprising a second plurality of field effect transistors and having a second output, and a summed output coupled to the first output and the second output, wherein gate widths or device sizes of the first plurality of field effect transistors monotonically decrease from the input to the first output, wherein gate widths or device sizes of the second plurality of field effect transistors monotonically decrease from the input to the second output, wherein for Class AB operation, the bias for the first distributed amplifier is set above a turn-on threshold voltage for the first distributed amplifier, wherein for Class A operation, the bias for the first distributed amplifier is set higher than for class AB operation and relatively high compared to the turn-on threshold voltage for the first distributed amplifier, and wherein for Class C operation, the bias for the second distributed amplifier is set below a turn-on threshold voltage for the second distributed amplifier.

In another embodiment disclosed herein, a method of providing a broadband linear amplifier comprises providing a first distributed amplifier coupled to an input and having a bias for one of Class A or Class AB operation, the first distributed amplifier comprising a first plurality of field effect transistors and having a first output, providing a second distributed amplifier coupled to the input and having a bias for Class C operation, the second distributed amplifier comprising a second plurality of field effect transistors and having a second output, and forming a summed output of the first output and the second output, wherein gate widths or device sizes of the first plurality of field effect transistors monotonically decrease from the input to the first output, wherein gate widths or device sizes of the second plurality of field effect transistors monotonically decrease from the input to the second output, wherein for Class AB operation, the bias for the first distributed amplifier is set above a turn-on threshold voltage for the first distributed amplifier, wherein for Class A operation, the bias for the first distributed amplifier is set higher than for class AB operation and relatively high compared to the turn-on threshold voltage for the first distributed amplifier, and wherein for Class C operation, the bias for the second distributed amplifier is set below a turn-on threshold voltage for the second distributed amplifier.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

In this disclosure a broadband linear amplifier design is described with two different distributed or traveling wave amplifiers combined together. One distributed amplifier may be biased for Class A or Class AB operation, and the other amplifier may be biased for Class C operation. As described further below, such different bias conditions for two distributed amplifiers provide a linearized output signal along with broadband gain. A broadband linear amplifier according to this disclosure can provide high linearity as well as enough gain across an extremely broadband with more than 10 octaves of frequency. The amplifier may be a power amplifier or used in a low noise amplifier (LNA).

Figure 1:
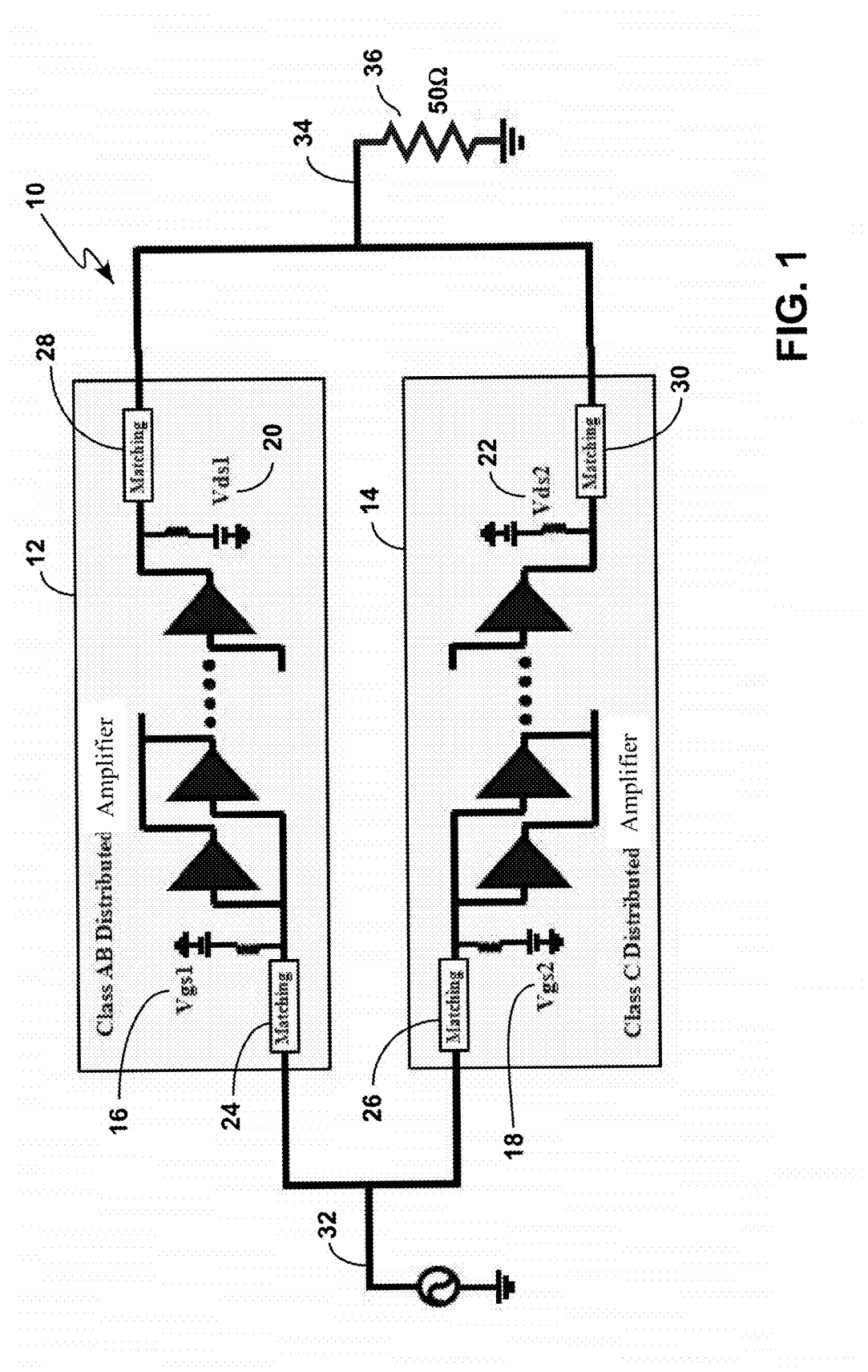
FIG. 1 shows a simplified diagram of a broadband linear distributed amplifier in accordance with the present disclosure.

FIG. 1 shows a simplified diagram of a broadband linear distributed amplifier 10 in accordance with the present disclosure. The first distributed amplifier 12 may biased for Class A or Class AB operation, and the second distributed amplifier 14 may be biased for Class C operation.

The amplifiers in each distributed amplifier 12 and 14 may be field effect transistors. For Class A operation the gate biases for field effect transistors in the distributed amplifier 12 are set relatively high compared to the device turn-on threshold voltage. For Class AB operation the gate biases for field effect transistors in the distributed amplifier 12 are set above the device turn-on threshold voltage, but not as high as the gate biases for class A operation. For Class C operation the gate biases for field effect transistors in the distributed amplifier 14 are set below or slightly below the device turn-on threshold voltage.

The gate to source bias Vgs1 16 for distributed amplifier 12 and the gate to source bias Vgs2 18 for distributed amplifier 14 may be different. Similarly, the drain to source bias Vds1 20 for distributed amplifier 12 and the drain to source bias Vds2 22 for distributed amplifier 14 may be different. Input matching circuits 24 and 26, which both may be pi network circuits, may be tuned differently. Similarly, output matching circuits 28 and 30, which both may be pi network circuits, may be tuned differently. The input 32 is distributed to the input matching circuits 24 and 26, and the output 34, which may be terminated as shown with a resistor 36 to ground is connected to output matching circuits 28 and 30.

Figure 2:
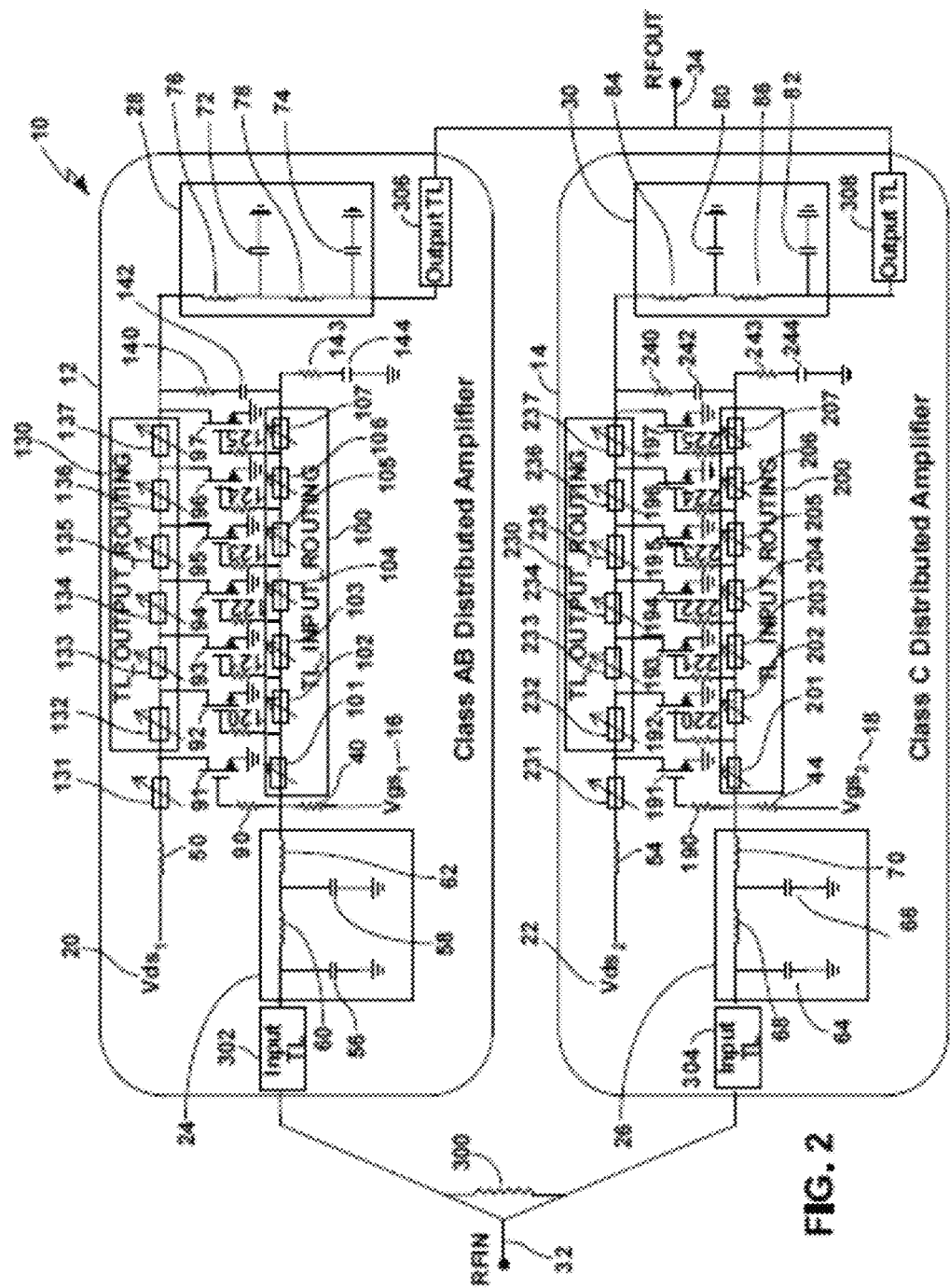
FIG. 2 shows detailed diagram of a broadband linear distributed amplifier in accordance with the present disclosure.

FIG. 2 shows a detailed circuit diagram of the broadband linear distributed amplifier 10. Both the Class AB amplifier 12 and Class C amplifier 14, shown in FIG. 2, have a distributed amplifier structure.

As shown in FIG. 2, the gate to source bias for distributed amplifier 12 is provided by voltage Vgs1 16. Resistor 40, which is a radio frequency (RF) choke resistor, is connected to Vgs1 16, the output of the input matching circuit 24, transmission line (TL) 101, and resistor 90. Similarly, the gate to source bias for distributed amplifier 14 is provided by voltage Vgs2 18. Resistor 44, which is a RF choke resistor, is connected to Vgs2 18, the output of the input matching circuit 26, transmission line (TL) 201, and resistor 190. Vgs1 16 may be different than Vgs2 18.

The drain to source bias for distributed amplifier 12 is provided by Vds1 20. Inductor 50 is connected between Vds1 20 and transmission line (TL) 131. The drain to source bias for distributed amplifier 14 is provided by Vds2 22. Inductor 54 is connected between Vds2 22 and transmission line (TL) 231. Vds1 20 may be different than Vds2 22.

Input matching circuit 24 may be a low-pass type pi-network circuit with two capacitors 56 and 58 tied to ground and two inductors 60 and 62. Input matching circuit 26 also may be a low-pass type pi-network circuit with two capacitors 64 and 66 tied to ground and two inductors 68 and 70. Output matching circuit 28 may be a low-pass type pi-network circuit with two capacitors 72 and 74 tied to ground and two inductors 76 and 78. Similarly output matching circuit 30 may be a low-pass type pi-network circuit with two capacitors 80 and 82 tied to ground and two inductors 84 and 86. The input matching circuits 24 and 26 and the output matching circuits 28 and 30 provide better matching at the input and output, respectively.

In distributed amplifier 12, the input matching circuit 24 is connected to resistor 40, to resistor 90, which is connected to the gate of field effect transistor (FET) 91, and to the transmission line (TL) input routing block 100, which has TLs connect to gates of FETs in the distributed amplifier 12.

The transmission line (TL) input routing block 100 has TL 101, TL 102, TL 103, TL 104, TL 105, TL 106, and TL 107 in series. Each of TL 101, TL 102, TL 103, TL 104, TL 105, TL 106, and TL 107 may be a variable time delay or have its length adjusted, in order to tune the distributed amplifier. The output of TL 101 is connected to resistor 120, which is connected to the gate of FET 92. Similarly, the output of TL 102 is connected to resistor 121, which is connected to the gate of FET 93, the output of TL 103 is connected to resistor 122, which is connected to the gate of FET 94, the output of TL 104 is connected to resistor 123, which is connected to the gate of FET 95, the output of TL 105 is connected to resistor 124, which is connected to the gate of FET 96, the output of TL 106 is connected to resistor 125, which is connected to the gate of FET 97.

The output of TL 107 is connected to termination resistor 143 and capacitor 144. TL 107 is also connected a feedback circuit including capacitor 142 and resistor 140, which is connected to TL output routing block 130, which has TLs 132, 133, 134, 135, 136, and 137 in series, and which are connected to drains of FETs in distributed amplifier 12. TL 137 is connected to feedback resistor 140 and also connected to inductor 76 in the output matching circuit 28.

The drain to source bias Vds1 20 is connected to TL 131, which in turn is connected to TL 132, and so on. The drain of FET 91 is connected to the input of TL 132, the drain of FET 92 is connected to the input of TL 133, the drain of FET 93 is connected to the input of TL 134, the drain of FET 94 is connected to the input of TL 135, the drain of FET 95 is connected to the input of TL 136, and the drain of FET 96 is connected to the input of TL 137. Each of TL 131, TL 132, TL 133, TL 134, TL 135, TL 136, and TL 137 may be a variable time delay or have its length adjusted, in order to tune the distributed amplifier.

The drain of FET 97 is connected to the output of TL 137, to the feedback resistor 140 and to the output matching circuit 28.

In distributed amplifier 14, the input matching circuit 26 is connected to resistor 44, to resistor 190, which is connected to the gate of field effect transistor (FET) 191, and to the transmission line (TL) input routing block 200, which is connected to gate of FETs in distributed amplifier 14.

The transmission line (TL) input routing block 200 has TL 201, TL 202, TL 203, TL 204, TL 205, TL 206, and TL 207 in series. Each of TL 201, TL 202, TL 203, TL 204, TL 205, TL 206, and TL 207 may be a variable time delay or have its length adjusted, in order to tune the distributed amplifier. The output of TL 201 is connected to resistor 220, which is connected to the gate of FET 192. Similarly, the output of TL 202 is connected to resistor 221, which is connected to the gate of FET 193, the output of TL 203 is connected to resistor 222, which is connected to the gate of FET 194, the output of TL 204 is connected to resistor 223, which is connected to the gate of FET 195, the output of TL 205 is connected to resistor 224, which is connected to the gate of FET 196, the output of TL 206 is connected to resistor 225, which is connected to the gate of FET 197.

The output of TL 207 is connected to termination resistor 243 and capacitor 244. TL 207 is also connected a feedback circuit including capacitor 242 and resistor 240, which is connected to TL output routing block 230, which has TLs 232, 233, 234, 235, 236, and 237 in series, which are connected to drains of FETs in distributed amplifier 14. TL 237 is connected to feedback resistor 240 and also connected to inductor 84 in the output matching circuit 30.

The drain to source bias Vds2 22 is connected to TL 231, which in turn is connected to TL 232, and so on. The drain of FET 191 is connected to the input of TL 232, the drain of FET 192 is connected to the input of TL 233, the drain of FET 193 is connected to the input of TL 234, the drain of FET 194 is connected to the input of TL 235, the drain of FET 195 is connected to the input of TL 236, and the drain of FET 196 is connected to the input of TL 237. Each of TL 231, TL 232, TL 233, TL 234, TL 235, TL 236, and TL 237 may be a variable time delay or have its length adjusted, in order to tune the distributed amplifier.

The drain of FET 197 is connected to the output of TL 237, to the feedback resistor 240 and to the output matching circuit 30.

The drains of the FETs in both distributed amplifier 12 and 14 do not have a resistor terminations, as is often the case in prior art amplifiers, which improves the power of the amplifier 10, because drain resistor terminations cause a loss of power.

Figure 7:
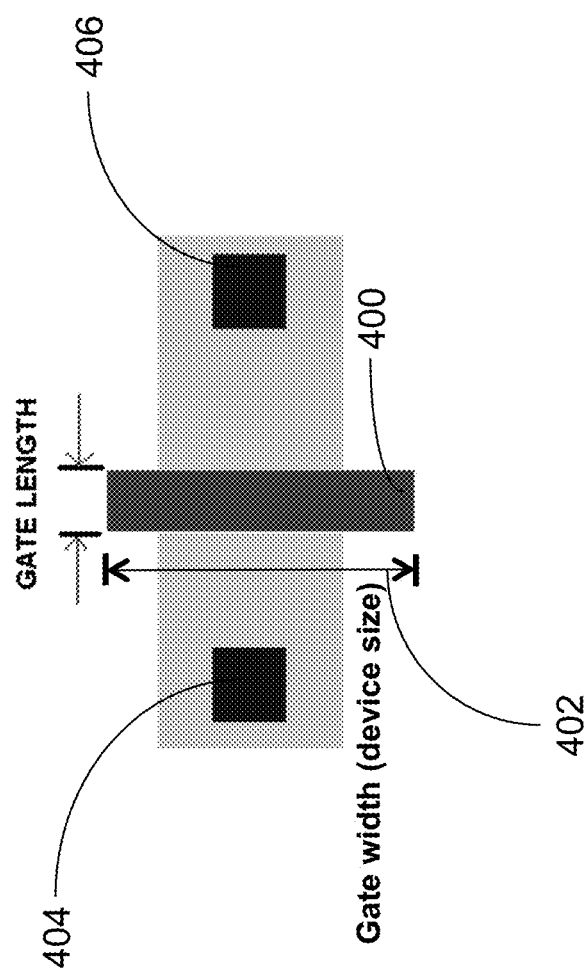
FIG. 7 shows a transistor illustrating a gate width or device size in accordance with the prior art.

The gate widths of each FET and the transmission line routing and lengths for each transmission line on the gate and drain side in each distributed amplifier 12 and 14 may be adjusted to obtain an optimal gain and linearity. FIG. 7 shows an example prior art transistor with a gate 400, a source 404 and a drain 406. FIG. 7 illustrates a gate width or device size 402 dimension, which is the definition of gate width and device size used in the present disclosure. Preferably, the gate widths of the FETs 91 to 97 in distributed amplifier 12 vary in a manner such that the gate width of FET 91 is longer than the gate width of FET 92, which has a gate width longer than the gate width of FET 93, which has a gate width longer than the gate width of FET 94, which has a gate width longer than the gate width of FET 95, which has a gate width longer than the gate width of FET 96, which has a gate width longer than the gate width of FET 97. Similarly, the gate widths of the FETs 191 to 197 in distributed amplifier 14 vary in a manner such that the gate width of FET 191 is longer than the gate width of FET 192, which has a gate width longer than the gate width of FET 193, which has a gate width longer than the gate width of FET 194, which has a gate width longer than the gate width of FET 195, which has a gate width longer than the gate width of FET 196, which has a gate width longer than the gate width of FET 197.

Therefore, preferably the FETs in each distributed amplifier decrease monotonically in gate width or device size from the input to the output of each distributed amplifier. Each stage of distributed amplifier 12 or 14 may have a gate width or device size that has about a 30% reduction from the gate width or device size of the previous stage in the distributed amplifier, although this reduction is not necessarily the same for each stage.

In an example embodiment, the distributed amplifier 12 may have five FETs and the distributed amplifier 14 may have four FETs with the following gate widths or device sizes for each stage. Stage 1 is coupled to the input and has the longest gate width or device size for each distributed amplifier 12 and 14.

|  | Distributed Amplifier 12 | Distributed Amplifier 14 |
| --- | --- | --- |
| Stage 1 | 130 μm | 115 μm |
| Stage 2 | 100 μm | 100 μm |
| Stage 3 | 80 μm | 80 μm |
| Stage 4 | 65 μm | 40 μm |
| Stage 5 | 60 μm | |

The power at input 32, as shown in FIG. 2, may be split between distributed amplifier 12 and distributed amplifier 14 using a 1:1 Wilkinson power divider 300. Further, to attain a third harmonic phase balance, the input transmission line 302 from the input 32 to the input matching circuit 24 may be adjusted, and the input transmission line 304 from the input 32 to the input matching circuit 26 may be adjusted. The output transmission line 306 from the output matching circuit 28 to the output 34, and the output transmission line 308 from the output matching circuit 30 to the output 34 may also be adjusted.

In order to block direct current (DC) from Vgs1 16 to the input 32, a capacitor may be connected between input matching circuit 24 and input TL 302, although a person skilled in the art would know that the blocking capacitor may be placed elsewhere in the circuit. Similarly, in order to block direct current (DC) from Vgs2 18 to the input 32, a capacitor may be connected between input matching circuit 26 and input TL 304.

Similarly, in order to block direct current (DC) from Vds1 20 to the output 34, a capacitor may be connected between output matching circuit 28 and output TL 306, although the blocking capacitor may be placed elsewhere in the circuit. Similarly, in order to block direct current (DC) from Vds2 22 to the output 34, a capacitor may be connected between output matching circuit 30 and output TL 308.

Figure 3:
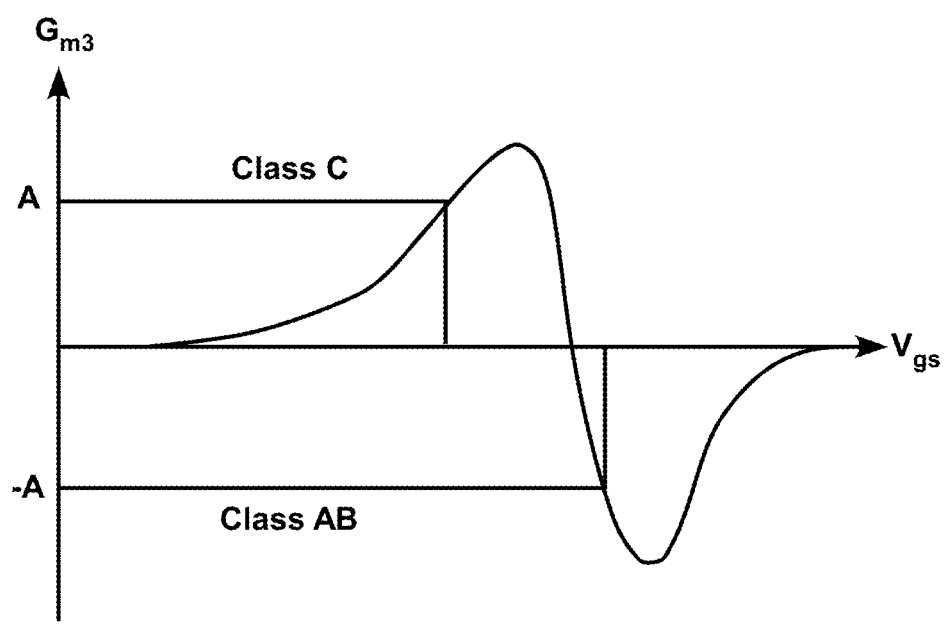
FIG. 3 shows a bias point for gm3 cancellation in accordance with the present disclosure.

FIG. 3 illustrates for an example simulation how the gate biases are set according to the gm3 curve. As shown in FIG. 3, the distributed amplifier 14, which is a Class C amplifier, has a gate bias Vgs2 18 set to a positive gm3 point. The distributed amplifier 12, which is a Class AB amplifier, has a gate bias Vgs1 16 set to a negative gm3 point. Since the polarities of the two gm3 are opposite, the generated two third harmonics are canceled. In this simulation, the threshold voltage (Vth) of the used GaN field-plated HEMI was −4.1V. The gate bias Vgs1 16 of the distributed amplifier 12 was set to −1.8V. The gate bias Vgs2 18 of the distributed amplifier 14 was set to −4.15V.

For gm3 cancellation, the amplitude balance of the third harmonics is also important for exact cancellation. To address this, the input pi-matching networks 24 and 26 may be tuned. Also, the resistors 90, 120, 121, 122, 123, 124 and 125 on each Vgs node in distributed amplifier 12, and the resistors 190, 220, 221, 222, 223, 224 and 225 on each Vgs node in distributed amplifier 14 may be adjusted.

The Vgs1 16, Vgs2 18, Vds1, and Vds2 may also be adjusted and may be set differently. The power gain may be changed for each distributed amplifier by changing the Vds1, and Vds2 settings.

In one example, the total summation of FET gate widths or device sizes in the distributed amplifier 12 may be 1800 μm, which is distributed across the multiple FETs in distributed amplifier 12, and the total summation of FET gate widths or device sizes in the distributed amplifier 14 may be 1750 μm, which is distributed across the multiple FETs in distributed amplifier 14.

To stabilize the distributed amplifier 12, the output of the TL output routing 130 is fed back via resistor 140 and capacitor 142 to the output of the TL input routing 100. Similarly, to stabilize the distributed amplifier 14, the output of the TL output routing 230 is fed back via resistor 240 and capacitor 242 to the output of the TL input routing 200.

In order to verify the performance of the amplifier according to this disclosure, a fully optimized linear distributed amplifier 10 was designed and compared to a prior art class AB amplifier. A GaN HEMI process model was used to simulate the broadband linear distributed amplifier 10 operating from 0.1 GHz to 8 GHz.

Figure 4:
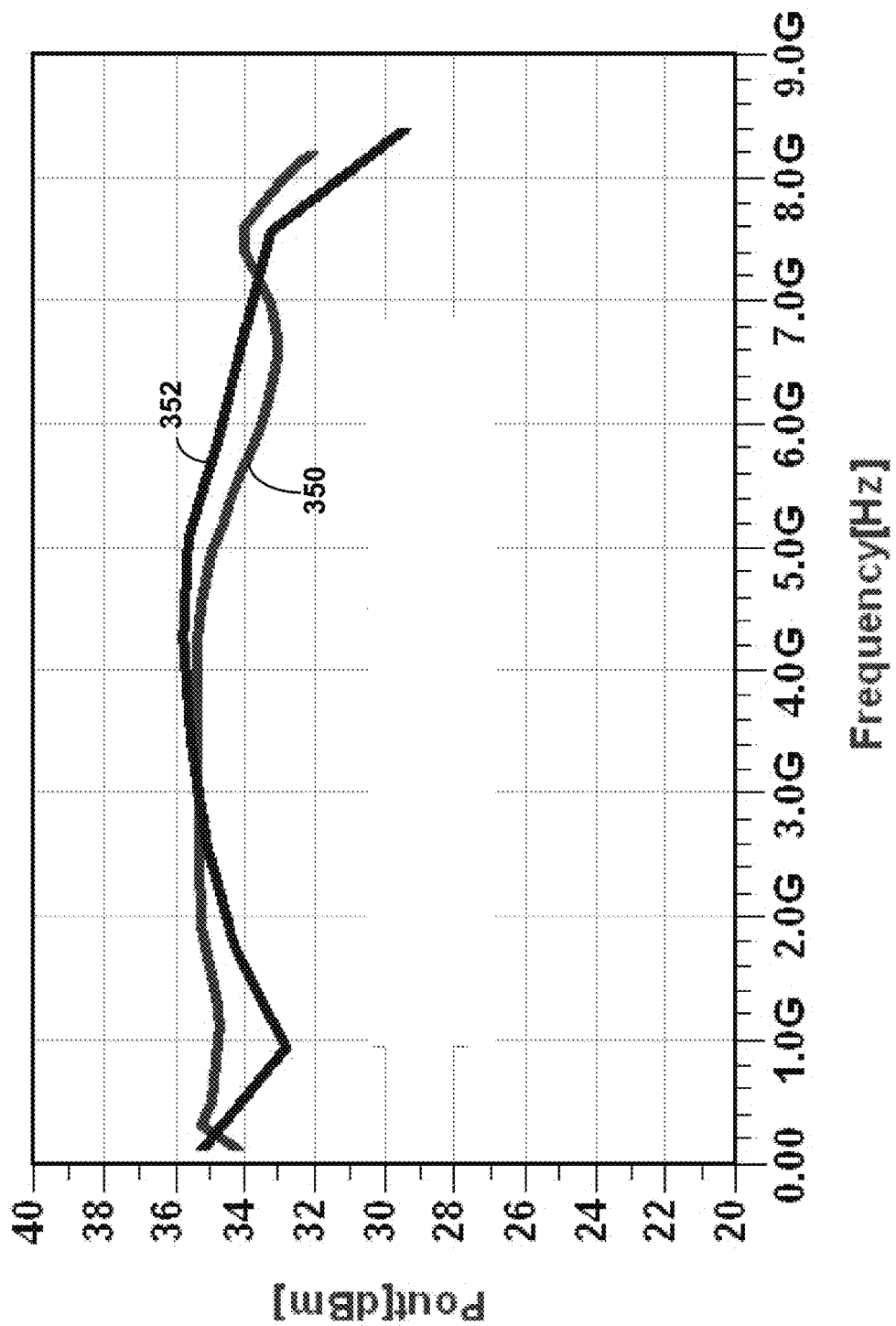
FIG. 4 shows a simulated power comparison in accordance with the present disclosure.
Figure 5:
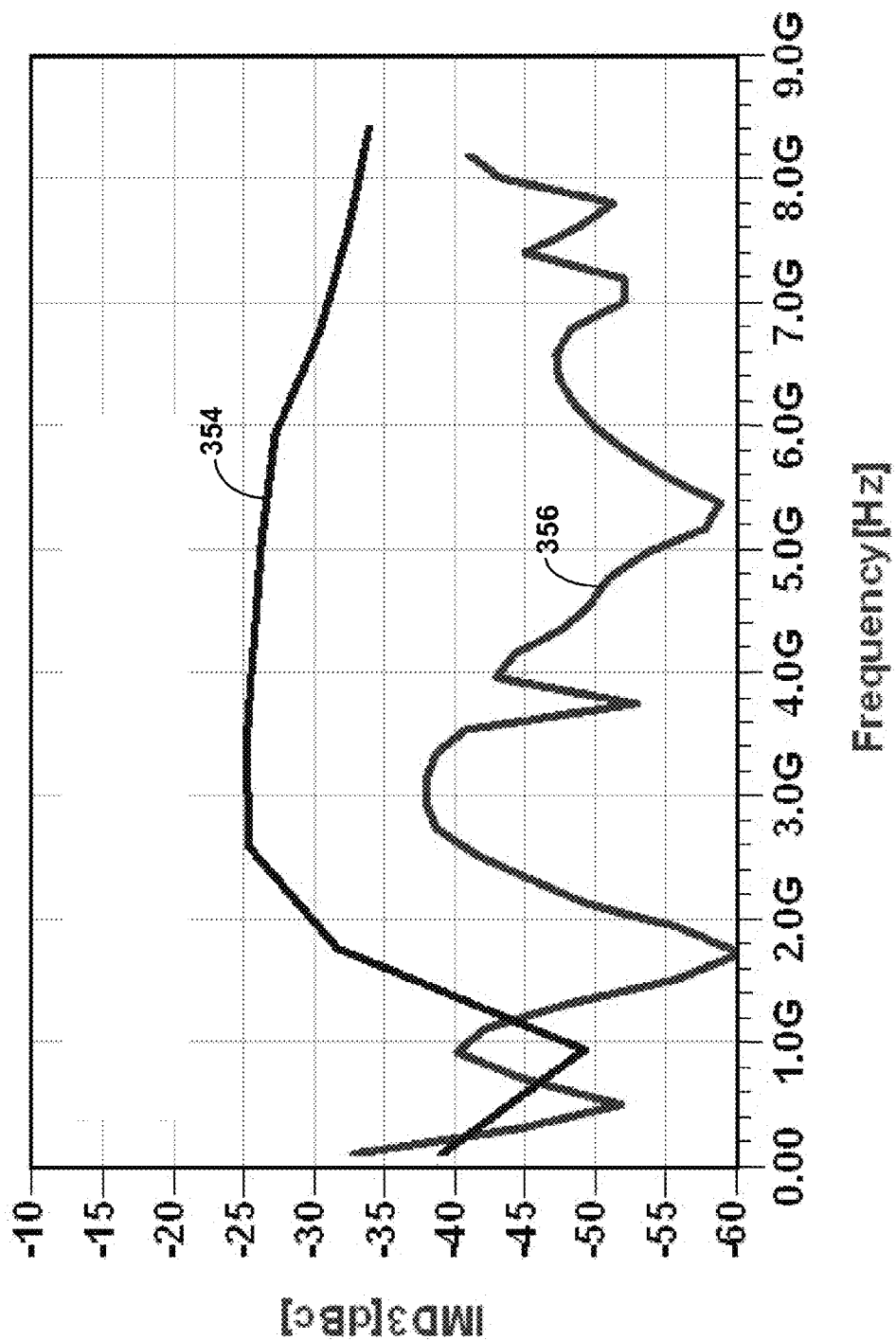
FIG. 5 shows a simulated third-order intermodulation distortion (IMD3) comparison in accordance with the present disclosure.

FIGS. 4 and 5 show the power and IMD3 comparison, respectively, between the class AB amplifier of the prior art and the distributed amplifier 10 of the present disclosure. IMD3 is defined by the ratio between the fundamental signal power and the third order harmonic power at the output in dB.

As shown in FIG. 4, the overall output power 350 of the distributed amplifier 10 of the present disclosure is close to the power 352 of the prior art amplifier across the whole band.

In FIG. 5, the IMD3 354 for the distributed amplifier 10 of the present disclosure shows an improvement over the IMD3 356 for the amplifier of the prior art of up to ~35 dB from 1 GHz to 8 GHz. In terms of the third order output intercept point (OIP3), the distributed amplifier 10 of the present disclosure achieves an improvement of up to 62 dBm at 5.5 GHz.

Figure 6:
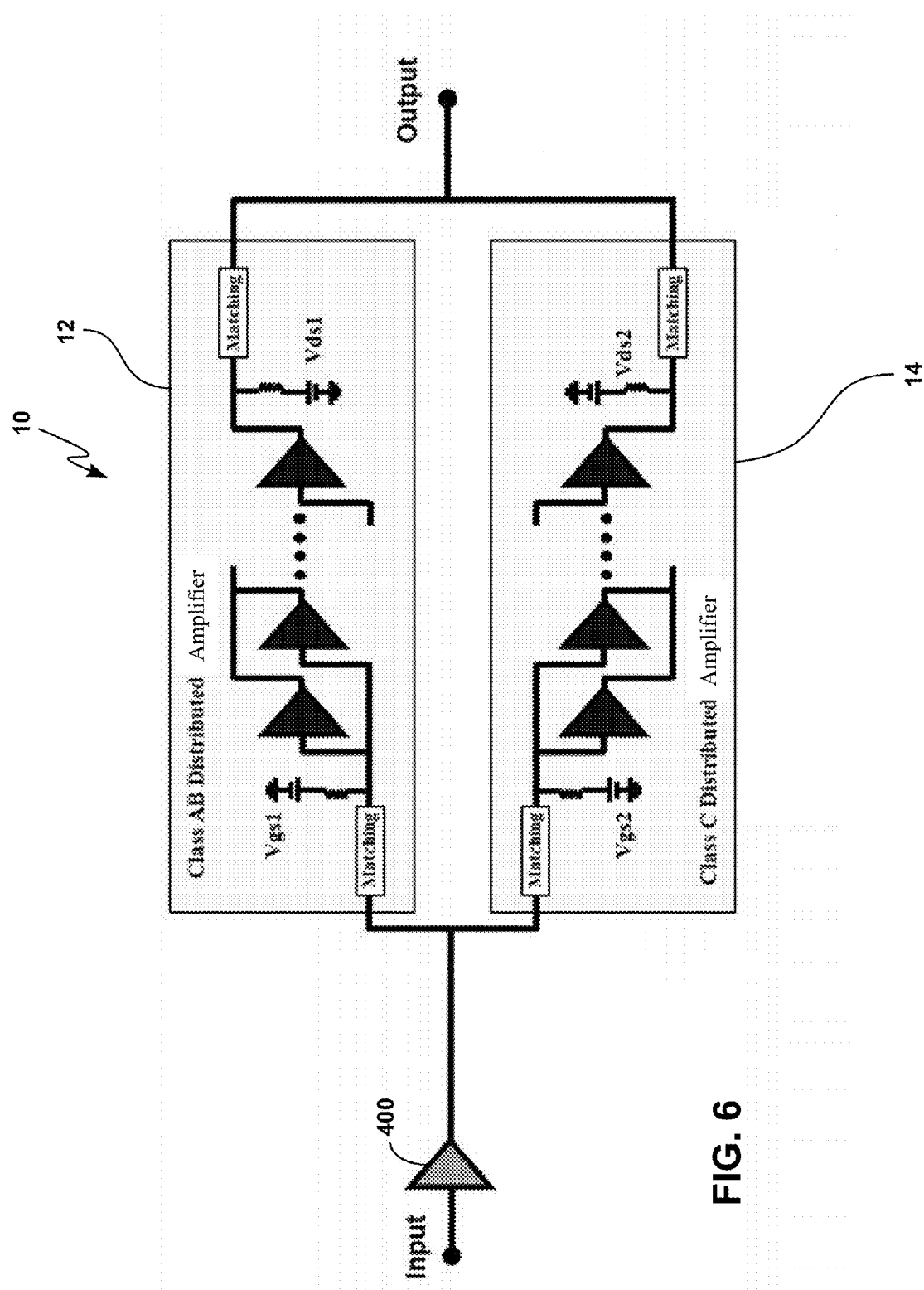
FIG. 6 shows an LNA with a first stage and a second stage amplifier in accordance with the present disclosure.

FIG. 6 shows an LNA with a first stage and a second stage amplifier in accordance with the present disclosure. The first stage 400 of the LNA may be a high gain and low noise figure (NF) stage. The second or output stage of the LNA may be a distributed amplifier 10 to obtain a high OIP3.

A power amplifier according to the present disclosure may have an ultra-wideband (100 MHz-8 GHz), and be a distributed GaN MMIC power amplifier 10. The output power of the distributed amplifier 10 may be greater than 4 W up to 6 GHz and greater than 2 W between 6-8 GHz. A GaN linear distributed amplifier 10 of the present disclosure can suppress intermodulation products by 15-20 dB more than prior art distributed GaN amplifiers without the linearization scheme of the present disclosure, and maintain this suppression over a wide instantaneous bandwidth.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A broadband linear amplifier comprising:
   an input;
   a first distributed amplifier coupled to the input and having a bias for one of Class A or Class AB operation, the first distributed amplifier comprising a first plurality of field effect transistors (FETs), each FET of the first plurality of FETs having a gate, a drain and a source, and wherein the first distributed amplifier has a first output;
   a second distributed amplifier coupled to the input and having a bias for Class C operation, the second distributed amplifier comprising a second plurality of field effect transistors, each FET of the second plurality of FETs having a gate, a drain and a source, and wherein the second distributed amplifier has a second output;
   a first plurality of serially connected variable delay lines or transmission line lengths, wherein each respective variable delay line or transmission line length of the first plurality of serially connected variable delay lines or transmission line lengths is connected to a respective drain of a respective FET of the first plurality of field effect transistors for tuning the first distributed amplifier, and wherein the first plurality of serially connected variable delay lines or transmission line lengths has a first serial delay line output;
   a second plurality of serially connected variable delay lines or transmission line lengths, wherein each respective variable delay line or transmission line length of the second plurality of serially connected variable delay lines or transmission line lengths is connected to a respective gate of a respective FET of the first plurality of field effect transistors for tuning the first distributed amplifier, and wherein the second plurality of serially connected variable delay lines or transmission line lengths has a second serial delay line output;
   a first passive feedback circuit coupled between the second serial delay line output and the first serial delay line output; and
   a summed output coupled to the first output and the second output;
   wherein for Class AB operation, the bias for the first distributed amplifier is set above a turn-on threshold voltage for the first distributed amplifier;
   wherein for Class A operation, the bias for the first distributed amplifier is set higher than for class AB operation and relatively high compared to the turn-on threshold voltage for the first distributed amplifier; and wherein for Class C operation, the bias for the second distributed amplifier is set below a turn-on threshold voltage for the second distributed amplifier;

wherein the first passive feedback circuit comprises a resistor connected in series to a capacitor.

2. The broadband linear amplifier of claim 1 wherein:
the bias for the first distributed amplifier is set to a negative gm3 point; and
the bias for the second distributed amplifier is set to a positive gm3 point;
wherein third harmonics of the first distributed amplifier are cancelled by harmonics of the second distributed amplifier.

3. The broadband linear amplifier of claim 1 further comprising:
a first input matching circuit coupled between the input and the first distributed amplifier;
a second input matching circuit coupled between the input and the second distributed amplifier;
a first output matching circuit coupled between the first output and the summed output; and
a second output matching circuit coupled between the second output and the summed output.

4. The broadband linear amplifier of claim 3 wherein:
the first input matching circuit comprises a pi network circuit;
the second input matching circuit comprises a pi network circuit;
the first output matching circuit comprises a pi network circuit; and
the second output matching circuit comprises a pi network circuit.

5. The broadband linear amplifier of claim 1 further comprising:
a Wilkinson power divider coupled to the input, the Wilkinson power divider coupled to the first distributed amplifier and the second distributed amplifier;
wherein the Wilkinson power divider divides power on the input between the first distributed amplifier and the second distributed amplifier.

6. The broadband linear amplifier of claim 1 wherein:
the bias for the first distributed amplifier comprises a first gate to source bias voltage coupled to the first plurality of field effect transistors; and
the bias for the second distributed amplifier comprises a second gate to source bias voltage coupled to the second plurality of field effect transistors.

7. The broadband linear amplifier of claim 6 further comprising:
a first drain to source bias voltage;
wherein each field effect transistor of the first plurality of field effect transistors has a drain coupled to the first drain to source bias voltage;
wherein each field effect transistor of the first plurality of field effect transistors has a source coupled to ground; and
wherein each field effect transistor of the first plurality of field effect transistors has a gate coupled to the first gate to source bias voltage; and
a second drain to source bias voltage;
wherein each field effect transistor of the second plurality of field effect transistors has a drain coupled to the second drain to source bias voltage;
wherein each field effect transistor of the second plurality of field effect transistors has a source coupled to ground; and wherein each field effect transistor of the second plurality of field effect transistors has a gate coupled to the second gate to source bias voltage.

8. The broadband linear amplifier of claim 7 wherein:
the first plurality of serially connected variable delay lines or transmission line lengths is coupled to the first drain to source bias voltage for adjusting a delay between the first drain to source bias voltage and each drain of the first plurality of field effect transistors for tuning the first distributed amplifier; and
the second plurality of serially connected variable delay lines or transmission line lengths is coupled to the first gate to source bias voltage for adjusting a delay between the first gate to source bias voltage and each gate of the first plurality of field effect transistors for tuning the first distributed amplifier;
the third plurality of serially connected variable delay lines or transmission line lengths is coupled to the second drain to source bias voltage for adjusting a delay between the second drain to source bias voltage and each drain of the second plurality of field effect transistors for tuning the second distributed amplifier; and
the fourth plurality of serially connected variable delay lines or transmission line lengths is coupled to the second gate to source bias voltage for adjusting a delay between the second gate to source bias voltage and each gate of the second plurality of field effect transistors for tuning the second distributed amplifier.

9. The broadband linear amplifier of claim 8 further comprising:
a first inductor coupled between the first drain to source bias voltage and the first plurality of serially connected variable delay lines or transmission line lengths;
a second inductor coupled between the second drain to source bias voltage and the third plurality of serially connected variable delay lines or transmission line lengths;
a first choke resistor coupled between the first gate to source bias voltage and the second plurality of serially connected variable delay lines or transmission line lengths; and
a second choke resistor coupled between the second gate to source bias voltage and the fourth plurality of serially connected variable delay lines or transmission line lengths.

10. A method of providing a broadband linear amplifier comprising:
providing a first distributed amplifier coupled to an input and having a bias for one of Class A or Class AB operation, the first distributed amplifier comprising a first plurality of field effect transistors (FETs), each FET of the first plurality of FETs having a gate, a drain and a source, and wherein the first distributed amplifier has a first output;
providing a second distributed amplifier coupled to the input and having a bias for Class C operation, the second distributed amplifier comprising a second plurality of field effect transistors, each FET of the second plurality of FETs having a gate, a drain and a source, and wherein the second distributed amplifier has a second output;
providing a first plurality of serially connected variable delay lines or transmission line lengths, wherein each respective variable delay line or transmission line length of the first plurality of serially connected variable delay lines or transmission line lengths is connected to a respective drain of a respective FET of the first plurality of field effect transistors for tuning the first distributed amplifier, and wherein the first plurality of serially connected variable delay lines or transmission line lengths has a first serial delay line output;

providing a second plurality of serially connected variable delay lines or transmission line lengths, wherein each respective variable delay line or transmission line length of the second plurality of serially connected variable delay lines or transmission line lengths is connected to a respective gate of a respective FET of the first plurality of field effect transistors for tuning the first distributed amplifier, and wherein the second plurality of serially connected variable delay lines or transmission line lengths has a second serial delay line output;

providing a first passive feedback circuit coupled between the second serial delay line output and the first serial delay line output; and forming a summed output of the first output and the second output;

wherein for Class AB operation, the bias for the first distributed amplifier is set above a turn-on threshold voltage for the first distributed amplifier;

wherein for Class A operation, the bias for the first distributed amplifier is set higher than for class AB operation and relatively high compared to the turn-on threshold voltage for the first distributed amplifier; and wherein for Class C operation, the bias for the second distributed amplifier is set below a turn-on threshold voltage for the second distributed amplifier;

wherein the first passive feedback circuit comprises a resistor connected in series to a capacitor.

11. The method of claim 10 wherein:

the bias for the first distributed amplifier is set to a negative gm3 point; and the bias for the second distributed amplifier is set to a positive gm3 point;

wherein third harmonics of the first distributed amplifier are cancelled by harmonics of the second distributed amplifier.

12. The method of claim 10 further comprising:

providing a first input matching circuit coupled between the input and the first distributed amplifier;

providing a second input matching circuit coupled between the input and the second distributed amplifier;

providing a first output matching circuit coupled between the first output and the summed output; and providing a second output matching circuit coupled between the second output and the summed output;

wherein:

the first input matching circuit comprises a pi network circuit;

the second input matching circuit comprises a pi network circuit;

the first output matching circuit comprises a pi network circuit; and the second output matching circuit comprises a pi network circuit.

13. The method of claim 10 wherein:

the bias for the first distributed amplifier comprises a first gate to source bias voltage coupled to the first plurality of field effect transistors; and the bias for the second distributed amplifier comprises a second gate to source bias voltage coupled to the second plurality of field effect transistors.

14. The method of claim 13 further comprising:

providing a first drain to source bias voltage;

wherein each field effect transistor of the first plurality of field effect transistors has a drain coupled to the first drain to source bias voltage;

wherein each field effect transistor of the first plurality of field effect transistors has a source coupled to ground; and wherein each field effect transistor of the first plurality of field effect transistors has a gate coupled to the first gate to source bias voltage; and providing a second drain to source bias voltage;

wherein each field effect transistor of the second plurality of field effect transistors has a drain coupled to the second drain to source bias voltage;

wherein each field effect transistor of the second plurality of field effect transistors has a source coupled to ground; and wherein each field effect transistor of the second plurality of field effect transistors has a gate coupled to the second gate to source bias voltage.

15. The method of claim 14 wherein:

the first plurality of serially connected variable delay lines or transmission line lengths is coupled to the first drain to source bias voltage for adjusting a delay between the first drain to source bias voltage and each drain of the first plurality of field effect transistors for tuning the first distributed amplifier;

the second plurality of serially connected variable delay lines or transmission line lengths is coupled to the first gate to source bias voltage for adjusting a delay between the first gate to source bias voltage and each gate of the first plurality of field effect transistors for tuning the first distributed amplifier;

the third plurality of serially connected variable delay lines or transmission line lengths is coupled to the second drain to source bias voltage for adjusting a delay between the second drain to source bias voltage and each drain of the second plurality of field effect transistors for tuning the second distributed amplifier; and the fourth plurality of serially connected variable delay lines or transmission line lengths is coupled to the second gate to source bias voltage for adjusting a delay between the second gate to source bias voltage and each gate of the second plurality of field effect transistors for tuning the second distributed amplifier.

16. The broadband linear amplifier of claim 1:

wherein device sizes of the first plurality of field effect transistors monotonically decrease from the input to the first output; and wherein device sizes of the second plurality of field effect transistors monotonically decrease from the input to the second output.

17. The method of claim 10:

wherein device sizes of the first plurality of field effect transistors monotonically decrease from the input to the first output; and wherein device sizes of the second plurality of field effect transistors monotonically decrease from the input to the second output.

18. The broadband linear amplifier of claim 1 further comprising:

a third plurality of serially connected variable delay lines or transmission line lengths, wherein each respective variable delay line or transmission line length of the third plurality of serially connected variable delay lines or transmission line lengths is connected to a respective drain of a respective FET of the second plurality of field effect transistors for tuning the second distributed amplifier, and wherein the third plurality of serially connected variable delay lines or transmission line lengths has a third serial delay line output;

a fourth plurality of serially connected variable delay lines or transmission line lengths, wherein each respective variable delay line or transmission line length of the fourth plurality of serially connected variable delay lines or transmission line lengths is connected to a respective gate of a respective FET of the second plurality of field effect transistors for tuning the second distributed amplifier, and wherein the fourth plurality of serially connected variable delay lines or transmission line lengths has a fourth serial delay line output; and a second passive feedback circuit coupled between the fourth serial delay line output and the third serial delay line output.

19. The method of claim 10 further comprising:

providing a third plurality of serially connected variable delay lines or transmission line lengths, wherein each respective variable delay line or transmission line length of the third plurality of serially connected variable delay lines or transmission line lengths is connected to a respective drain of a respective FET of the second plurality of field effect transistors for tuning the second distributed amplifier, and wherein the third plurality of serially connected variable delay lines or transmission line lengths has a third serial delay line output;

providing a fourth plurality of serially connected variable delay lines or transmission line lengths, wherein each respective variable delay line or transmission line length of the fourth plurality of serially connected variable delay lines or transmission line lengths is connected to a respective gate of a respective FET of the second plurality of field effect transistors for tuning the second distributed amplifier, and wherein the fourth plurality of serially connected variable delay lines or transmission line lengths has a fourth serial delay line output; and providing a second passive feedback circuit coupled between the fourth serial delay line output and the third serial delay line output.

20. The broadband linear amplifier of claim 18 wherein the second passive feedback circuit comprises a resistor connected in series to a capacitor.

21. The method of claim 19 wherein the second passive feedback circuit comprises a resistor connected in series to a capacitor.

\* \* \* \* \*